(12) United States Patent
Hagi

(10) Patent No.: US 6,778,377 B2
(45) Date of Patent: Aug. 17, 2004

(54) ELECTROSTATIC CHUCKING SYSTEM, AND APPARATUS AND METHOD OF MANUFACTURING A SEMICONDUCTOR DEVICE USING THE ELECTROSTATIC CHUCKING SYSTEM

(75) Inventor: Kimio Hagi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 225 days.

(21) Appl. No.: 09/732,891

(22) Filed: Dec. 11, 2000

(65) Prior Publication Data

US 2001/0055189 A1 Dec. 27, 2001

(30) Foreign Application Priority Data

Jun. 22, 2000 (JP) .......................................... 2000-188382

(51) Int. Cl.$^7$ ............................................ H01T 23/00
(52) U.S. Cl. ........................................................ 361/234
(58) Field of Search ................................ 361/233, 234, 361/195

(56) References Cited

U.S. PATENT DOCUMENTS

| | | | | |
|---|---|---|---|---|
| 5,872,694 A | * | 2/1999 | Hoinkis et al. ............. | 361/234 |
| 5,948,986 A | * | 9/1999 | Brown ........................ | 73/630 |
| 6,244,121 B1 | * | 6/2001 | Hunter ........................ | 73/865.9 |
| 6,252,758 B1 | * | 6/2001 | Nagao et al. ............... | 279/128 |

FOREIGN PATENT DOCUMENTS

JP         11-251420        9/1999

* cited by examiner

Primary Examiner—Gregory J. Toatley, Jr.
Assistant Examiner—Boris Benenson
(74) Attorney, Agent, or Firm—McDermott Will & Emery LLP

(57) ABSTRACT

A voltage is applied to an electrode of an electrostatic chuck for chucking a semiconductor substrate, and the application voltage is controlled stepwise by means of a voltage control section. In the electrostatic chucking system, a temperature sensor may be provided for detecting the temperature of the semiconductor substrate held by the electrostatic chuck, wherein a signal output from the temperature sensor is input to the voltage control section to thereby control the applied voltage.

5 Claims, 2 Drawing Sheets

ELECTROSTATIC CHUCKING SYSTEM, AND APPARATUS AND METHOD OF MANUFACTURING A SEMICONDUCTOR DEVICE USING THE ELECTROSTATIC CHUCKING SYSTEM

BACKGROUND OF THE INVENTION

1. Field of the Invention

The present invention relates to an improvement in an electrostatic chucking system having an electrode for chucking a semiconductor substrate or wafer. More particularly, the present invention relates to an improvement in an electrostatic chuck for holding a wafer during processing of a wafer, such as formation of a film, which involves a change in the temperature of the wafer.

2. Background Art

In a semiconductor manufacturing process, an electrostatic chuck has conventionally been used for fixing and holding a semiconductor substrate at the time of processing of a semiconductor substrate (i.e., a semiconductor wafer) by means of a sputtering apparatus or a dry etching apparatus. In this case, a wafer is fixed by means of a voltage applied to an electrostatic chuck. FIG. 4 is a graph showing application of a voltage to the electrode of a conventional electrostatic chuck, in which a predetermined voltage is applied to the electrostatic chuck at a required point in time.

In a process, such as a hot aluminum (Hot Al) process or a reflow aluminum (Reflow Al) process, in which a film is formed while involving a change in the temperature of the wafer, the wafer tends to warp or bend. The amount of warpage arising in the wafer or expansion of the wafer varies with a change in the temperature of the wafer in a film formation process. For this reason, the wafer cannot be properly chucked or held by use of an electrostatic chuck. Alternatively, there arises a failure, such as a wafer held by an electrostatic chuck coming off the electrostatic chuck during the film formation process. There also arise problems, such as an increase in the amount of contaminants included in the underside of a wafer or occurrence of cracks in a wafer.

SUMMARY OF THE INVENTION

The present invention has been conceived to solve such a problems in the background art and is aimed at providing an electrostatic chucking system capable of stably holding a wafer.

According to one aspect of the present invention, an electrostatic chucking system comprises an electrostatic chuck, a power supply and a voltage control section. The electrostatic chuck has an electrode for chucking a semiconductor substrate. The power supply section applies a voltage to the electrode. The voltage control section controls the applied voltage, wherein the voltage control section varies and controls the applied voltage stepwise.

In another aspect, in the electrostatic chucking system, a temperature sensor may be provided for detecting the temperature of the semiconductor substrate held by the electrostatic chuck, wherein a signal output from the temperature sensor is input to the voltage control section to thereby control the applied voltage.

In another aspect, in the electrostatic chucking system, a warpage sensor may be provided for detecting the amount of warpage arising in the semiconductor substrate held by the electrostatic chuck, wherein a signal output from the warpage sensor is input to the voltage control section to thereby control the applied voltage.

In another aspect, in the electrostatic chucking system, a distance sensor may be provided for detecting the distance between the electrostatic chuck and the semiconductor substrate held by the electrostatic chuck, wherein a signal output from the distance sensor is input to the voltage control section to thereby control the applied voltage.

Other features and advantages of the invention will be apparent from the following description taken in connection with the accompanying drawings.

DETAILED DESCRIPTION OF THE PREFERRED EMBODIMENTS

First Embodiment

Figure 1:
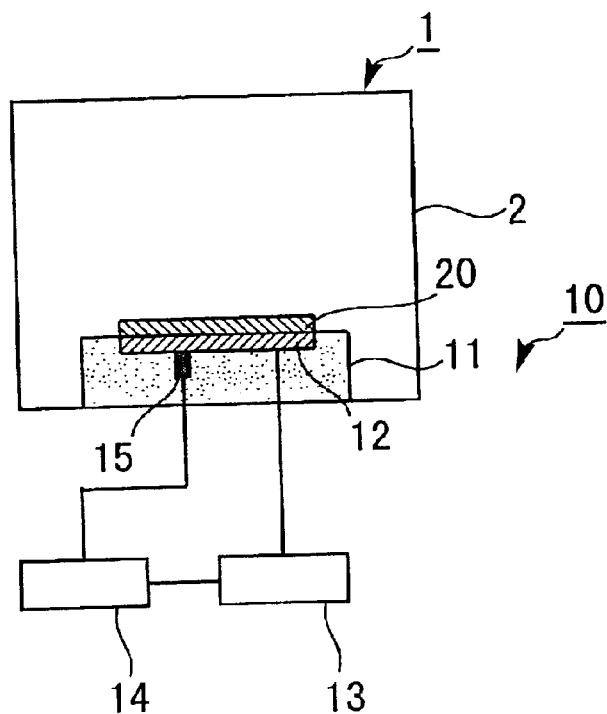
FIG. 1 is a schematic diagram showing an electrostatic chuck according to a first embodiment of the present invention applied in a sputtering system.

FIG. 1 is a diagram schematically showing application of an electrostatic chuck to a sputtering system according to a first embodiment of the present invention.

In FIG. 1, reference numeral 1 designates a sputtering system; 2 designates a chamber; 10 designates an electrostatic chuck system according to the present invention; 11 designates an electrostatic chuck of the electrostatic chuck system; 12 designates an electrode constituting a portion of the electrostatic chuck 11; 13 designates a power supply section for supplying a voltage to the electrode 12; and 14 designates a voltage control section for controlling an application voltage supplied by the power supply section 13.

Reference numeral 20 designates a semiconductor substrate (hereinafter referred to simply as a "wafer") chucked by the electrostatic chuck 11. The voltage applied to the electrode 12 of the electrostatic chuck 11 generates a chucking force and exerts the chucking force to the wafer 20, wherewith the wafer 20 is held by the electrostatic chuck 11. Thus, the chucking force is dependent on the voltage applied to the electrode 12.

FIG. 1 shows an example in which the chucking system is applied to a sputtering system. The chucking system may be applied to another substrate processing system, such as a CVD system or a dry etching system.

Depending on the requirements or processes for processing the wafer 20 within the chamber 2, variation arises in the temperature of the wafer 20. In this case, the rate of variation in the temperature of the wafer 20 is affected by the distance or gap between the electrostatic chuck 11 and the wafer 20. The gap is determined by a chucking force, and a key parameter which determines the chucking force is the voltage applied to the electrode 12 of the electrostatic chuck 11. Therefore, so long as the voltage applied to the electrode 12 is controlled, the rate of variation in the temperature of the wafer 20 can be controlled.

Figure 2:
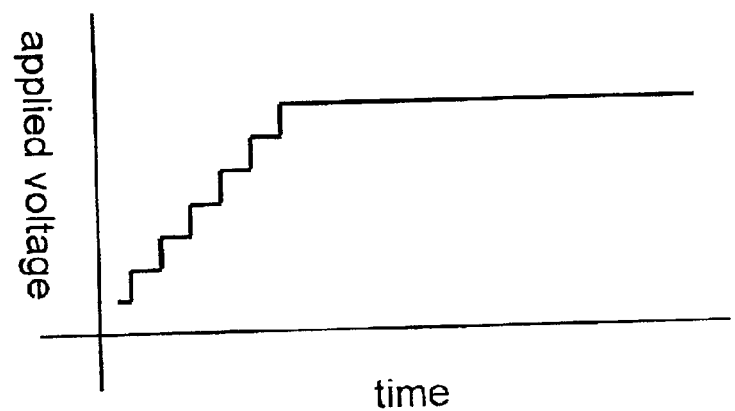
FIG. 2 is a graph showing an example in which a chucking voltage is increased stepwise with time.

FIG. 2 is a graph showing an example in which a chucking voltage is increased stepwise with time. In response to the stepwise increase in applied voltage, the chucking force exerted on the wafer 20 can also be increased stepwise.

As a result, the rate at which the temperature of the wafer 20 varies is decreased, and the rate of change in a wafer shape which affects the chucking force exerted on the wafer 20 is decreased, thereby avoiding a chucking failure and formation of cracks in a wafer.

Variation in the temperature of the wafer 20 is predicted in accordance with a preset processing program stored in, for example, the sputtering system 1. If a control program for controlling a voltage applied to the electrode 12 of the electrostatic chuck 11 is incorporated in the voltage control section 14 so as to correspond to the processing program, an application voltage can be controlled. On the basis of variations in the preset processing conditions, variation in the temperature of the wafer 20 can be predicted, to thereby control an application voltage.

It may also be possible to provide the electrostatic chucking system 10 with another temperature sensor (not shown) for sensing rapid variation in the atmospheric temperature of a chamber or variation in the temperature of the electrostatic chuck 11, and the application voltage may be controlled while the thus-detected variation in temperature is taken as a trigger.

A program or sequence stored in the voltage control section 14 is changed or selected in accordance with processing to which the wafer 20 is to be subjected to, as required. Further, the program or sequence may be started, changed, or set from the outside, as required.

The electrostatic chucking system 10 may be provided with a sensor for detecting a change a condition of the chamber 1 or a change in the condition of the wafer 20. A signal output from the sensor is supplied to the voltage control section 14, to thereby control an application voltage. An electrostatic chucking system equipped with such a sensor will be described in connection with second and subsequent embodiments.

In a case where the application voltage is increased stepwise, the number of steps is not important. Control of an application voltage is strictly for the purpose of controlling the rate of variation in the temperature of the wafer 20 (i.e., a rate at which the temperature of the wafer 20 is increased). In such a case, the rate at which the temperature of the wafer 20 is increased is preferably controlled so as to fall within the range of 10° C./sec. to 150° C./sec.

Variation in an application voltage can be controlled in real time in accordance with a change in a detected temperature.

In the foregoing description, the application voltage is increased stepwise. However, if necessary, the application voltage may be lowered. Particularly after chucking of the wafer 20 has been completed, the application voltage may be lowered to a voltage level required for retaining the wafer 20.

Second Embodiment

In the second embodiment, the temperature of a wafer is used as a parameter for controlling a voltage applied to the electrostatic chucking system.

In the second embodiment, as shown in FIG. 1, the electrostatic chucking system 10 is provided with a temperature measurement device comprising a sensor 15 for monitoring the temperature of the wafer 20. The signal output from the sensor 15 is input to the voltage control section 14, thereby controlling the voltage applied to the electrode 12 of the electrostatic chuck 11.

More specifically, the temperature of the wafer 20 is monitored through use of the sensor 15, from a point in time at which the wafer 20 is placed on the electrostatic chuck 11. The temperature of the wafer 20 is monitored, and variation in the temperature of the wafer 20 is controlled so as to become stable or fall within a predetermined range. In short, the rate at which the temperature of the wafer 20 is increased is maintained constant or within a predetermined range. Alternatively, the application voltage is varied stepwise such that variation in the temperature of the wafer 20 matches a programmed temperature.

Alternatively, when the rate at which the temperature of the wafer varies exceeds a preset rate, control of an application voltage may be started through use of the sensor 15 for monitoring the temperature of the wafer 20.

Third Embodiment

In a third embodiment of the present invention, the amount of warpage in a wafer is used as a parameter for controlling an application voltage used in the electrostatic chucking system 10.

Figure 3:
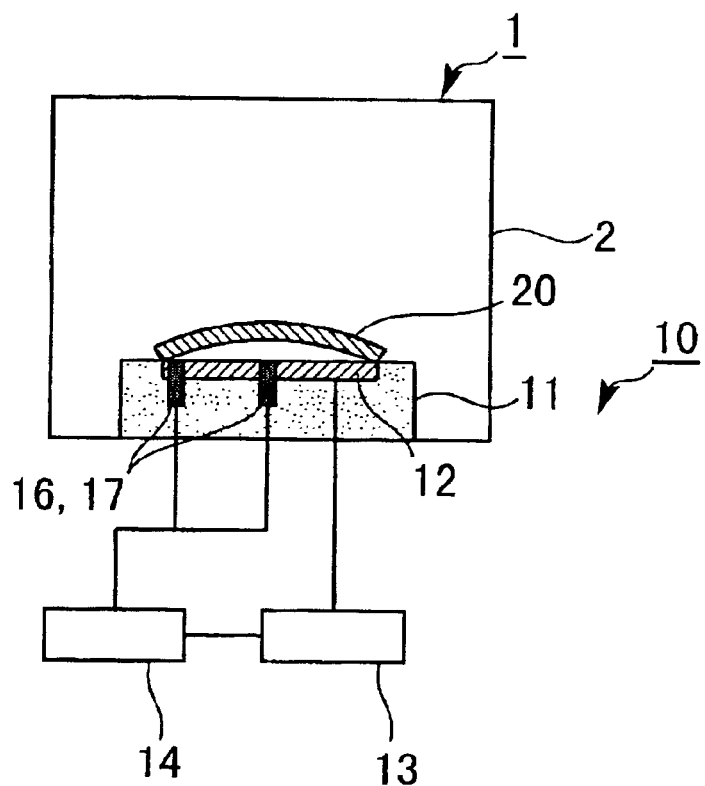
FIG. 3 is a schematic diagram showing the configuration of an electrostatic chucking system according to the third embodiment of the present invention.
Figure 4:
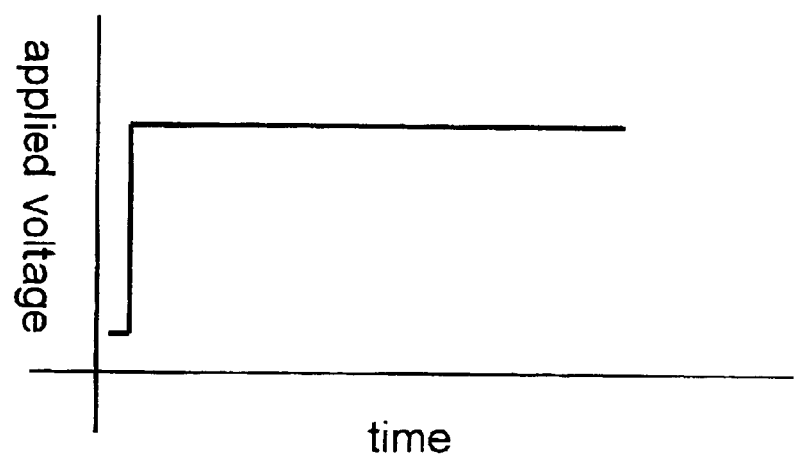
FIG. 4 is a graph showing a voltage applied to an electrode of a conventional electrostatic chuck.

FIG. 3 is a diagram showing the schematic configuration of an electrostatic chucking system according to the present embodiment.

In the present embodiment, as shown in FIG. 3, the electrostatic chucking system 10 is provided with a warpage measurement device comprising a warpage sensor 16 for monitoring the amount of warpage arising in the wafer 20. The signal output from the warpage sensor 16 is input to the voltage control section 14, to thereby control the voltage applied to the electrode 12 of the electrostatic chuck 11.

The amount of warpage arising in the wafer 20 held by the electrostatic chuck 11 changes greatly in accordance with a change in temperature. Specifically, in a case where the temperature of the wafer 20 changes at a great rate, the amount of warpage arising in the wafer 20 also becomes greater. So long as the amount of warpage arising in the wafer 20 is controlled so as to become equal to or smaller than a predetermined value, the rate, at which the temperature of the wafer 20 is changed, is suppressed. In order to control the rate at which the temperature of the wafer 20 is changed, the voltage applied to the electrostatic chuck 11 is controlled. For example, in a case where the rate, at which the temperature of the wafer 20 is changed, is in the process of becoming greater, the application voltage is lowered, to thereby suppress variation in the temperature of the wafer 20.

By way of illustration, the amount of warpage arising in the wafer 20 is monitored from a point in time when the wafer 20 is placed on the electrostatic chuck 11. The application voltage is changed stepwise such that variation in the amount of warpage becomes constant, falls within a predetermined range, or matches a programmed value.

At the time of an increase in a chucking voltage, the chucking voltage is increased while the amount of warpage arising in the wafer 20 is monitored. In short, variation in the amount of warpage arising in the wafer 20 is controlled so as to become constant or become equal to or smaller than a predetermined value.

An optical warpage measurement device or a capacitive measurement device can be used as means to determine the amount of warpage arising in the wafer 20. The optical warpage measurement device radiates a laser beam onto a plurality of locations on the underside of the wafer 20 and measures the light reflected from the locations, to thereby observe offsets in the respective locations and detect a warpage of the wafer 20.

The capacitive measurement device measures electrostatic capacitance present between the underside of the wafer 20 and a plurality of electrodes which are provided on the surface of the electrostatic chuck so as to oppose the plurality of locations, thereby detecting the amount of warpage arising in the wafer 20.

Thus, in the present embodiment, the amount of warpage arising in the wafer 20 is used as a parameter for controlling the voltage applied to the electrostatic chuck 11.

Fourth Embodiment

In a fourth embodiment of the present invention, the gap or distance between a wafer and an electrostatic chuck is used as a parameter for controlling the voltage applied to an electrostatic chucking system.

FIG. 3 is a schematic diagram showing the configuration of an electrostatic chucking system according to the present embodiment.

In the present embodiment, the electrostatic chucking system 10 is provided with a distance measurement device comprising a distance sensor 16 for monitoring the distance between the wafer 20 and the electrostatic chuck 11. The signal output from the distance sensor 16 is input to the voltage control section 14, to thereby control the voltage applied to the electrode 12 of the electrostatic chuck 11.

In a case where the wafer 20 is warped in a concave shape, a separation or a gap (hereinafter called a "distance") arises between the electrostatic chuck 11 and the center of the wafer 20. More specifically, the outer edge of the wafer 20 is in contact with the electrostatic chuck 11, and a distance arises between the center of the wafer 20 and the electrostatic chuck 11. The greater the distance, the temperature of the wafer 20 tends to become lower. In contrast, the shorter the distance, the temperature of the wafer 20 tends to become higher. Accordingly, so long as the distance between the wafer 20 and the electrostatic chuck 11 is controlled so as to assume a predetermined variable value, the rate at which the temperature of the wafer 20 is changed is suppressed. In order to control the rate at which the temperature of the wafer 20 is changed, the voltage applied to the electrostatic chuck 11 is controlled. For example, in a case where the distance between the wafer 20 and the electrostatic chuck 11 is about to increase, the voltage applied to the electrode 12 of the electrostatic chuck 11 is lowered, to thereby suppress variation in the temperature of the wafer 20.

The distance between the wafer 20 and the electrostatic chuck 11 is monitored from a point in time when the wafer 20 is placed on the electrostatic chuck 11. An application voltage is changed stepwise such that variation in the distance becomes constant, falls within a predetermined range, or matches a programmed value.

A chucking voltage is increased while the distance between the wafer 20 and the electrostatic chuck 11 is monitored and the distance is controlled to a constant value or to become equal to or lower than a predetermined value.

The distance between the wafer 20 and the electrostatic chuck 11 can be measured through use of a capacitive measuring device. The capacitive measurement device measures electrostatic capacitance present between the underside of the wafer 20 and the electrode 12 which is provided on the surface of the electrostatic chuck 11 so as to oppose substantially the center of the wafer 20, to thereby observe variation in electrostatic capacitance. Thus, the distance between the wafer 20 and the electrostatic chuck 11 is detected.

The distance between the wafer 20 and the electrostatic chuck 11 can also be measured by means of radiating a laser beam onto a single point or a plurality of points on the wafer 20, thus measuring displacement in the wafer 20.

More specifically, the distance between the electrostatic chuck 11 and the wafer 20 is measured at the center and periphery of the wafer 20. For instance, the thus measured greatest distance is monitored, and an application voltage is varied stepwise such that the thus-monitored value becomes constant or matches a programmed value.

In the present embodiment, the distance between the wafer 20 and the electrostatic chuck 11 is used as a parameter for controlling the voltage applied to the electrostatic chuck 11.

As mentioned in connection with the first embodiment, control of variation in an application voltage involves both increase and decrease in voltage. This applies to the second through fourth embodiments.

Desirably, an application voltage is controlled such that a rate at which the temperature change of a semiconductor substrate falls within the range of 10° C./sec. to 150° C./sec. The same also applies to the second through fourth embodiments.

As mentioned above, in a chucking system for use with a sputtering system, etc. according to the present invention, a voltage used for chucking and holding a wafer is controlled, thereby preventing occurrence of a sharp variation in the temperature of a wafer. Accordingly, there can be prevented a failure to chuck a wafer, cracks in a wafer, or contamination of an underside of a wafer.

According to the present invention, there is obtained a method of manufacturing a semiconductor device comprising a step of treating a semiconductor wafer through use of the electrostatic chucking system as described above.

Further, according to the present invention, there is obtained an apparatus for manufacturing a semiconductor device which comprises the electrostatic chucking system as described above.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-188382, filed on Jun. 22, 2000 including specification, claims, drawings and summary, on which the Convention priority of the present application is based, are incorporated herein by reference in its entirety.

What is claimed is:

1. An electrostatic chucking system comprising:

an electrostatic chuck having an electrode for chucking a semiconductor substrate;

a power supply section for applying a voltage to said electrode; and a voltage control section for controlling the applied voltage, wherein said voltage control section varies and controls the applied voltage stepwise, and wherein the applied voltage is controlled such that a rate at which the temperature change of the semiconductor substrate falls with a range of 10° C./sec. to 150° C./sec.

2. The electrostatic chucking system according to claim 1, further comprising a temperature sensor for detecting the temperature of the semiconductor substrate held by said electrostatic chuck, wherein a signal output from said temperature sensor is input to said voltage control section to thereby control the applied voltage.

3. The electrostatic chucking system according to claim 1, wherein the control of variation in the applied voltage involves either increase or decrease in voltage.

4. A method of manufacturing a semiconductor device comprising a step of treating a semiconductor wafer through use of the electrostatic system according to claim 1.

5. An apparatus for manufacturing a semiconductor device, said apparatus comprising the electrostatic system according to claim 1.

* * * * *